United States Patent [19]

Soref

[11] Patent Number: 5,013,113

[45] Date of Patent: May 7, 1991

[54] LOSSLESS NON-INTERFEROMETRIC ELECTRO-OPTIC III-V INDEX-GUIDED-WAVE SWITCHES AND SWITCHING ARRAYS

[75] Inventor: Richard A. Soref, Newton Centre, Mass.

[73] Assignee: The United States of America as represented by the Secretary of the Air Force, Washington, D.C.

[21] Appl. No.: 403,216

[22] Filed: Aug. 31, 1989

[51] Int. Cl.$^5$ .............................................. G02F 1/29
[52] U.S. Cl. ................................ 350/96.13; 350/96.14
[58] Field of Search ................. 350/96.13, 96.14, 354, 350/355

[56] References Cited

U.S. PATENT DOCUMENTS 4,717,228 1/1988 Thylén ............................. 350/96.14
4,743,087 5/1988 Utaka et al. ...................... 350/96.13

FOREIGN PATENT DOCUMENTS 62-262834 11/1987 Japan ................................ 350/96.14

Primary Examiner—John D. Lee
Assistant Examiner—John Ngo
Attorney, Agent, or Firm—Robert L. Nathans; Donald J. Singer

[57] ABSTRACT

Lossless guided-wave switches with more than 30 dB of crosstalk-isolation are comprised of branched channel waveguides with laser-like cross-sections. Optical gain, sufficient to overcome power-splitting losses, is provided by carrier-injection currents. Due to its low-noise properties, the single-quantum-well structure is found to be optimum for cascading switches into a multi-stage network. A lossless 1×N network with 1024 switched outputs should be feasible.

32 Claims, 4 Drawing Sheets

LOSSLESS NON-INTERFEROMETRIC ELECTRO-OPTIC III-V INDEX-GUIDED-WAVE SWITCHES AND SWITCHING ARRAYS

STATEMENT OF GOVERNMENT INTEREST

The invention described herein may be manufactured and used by or for the Government for governmental purposes without the payment of any royalty thereon.

BACKGROUND OF THE INVENTION

The present invention relates to the field of optical switching. The use of traveling-wave optical amplifiers for 2×2 switching was demonstrated by Ikeda, see M. Ikeda, "Proposal of laser diode integrated-optical matrix switches", Trans. IECE Japan, vol. E69, 1072–1074 (Oct. 10, 1986), who fashioned his integrated-optical device from laser-like InGaAsP/InP ridged waveguides. Also see U.S. Pat. No. 4,521,069 to Ikeda.

A number of problems became evident with his disclosed devices. First, the small radius of curvature in the curved guides introduced a large radiation loss in those channels. Second, the optical paths do not have the same length, which leads to different biasing requirements for the cross and bar states. Third, the choice of bulk material is not optimum because of noise problems discussed below, and because the optical gain in a waveguide per unit of injection current is smaller in bulk than in multiple-quantum-well (MQW) material. Lossless operation (zero dB insertion loss) is an important goal for the switches of the present invention.

In U.S. Pat. No. 4,778,235, the inventor, Fujiwara discloses switches which utilize the lateral spreading or fanning out of light, to produce the desired light losses at selected legs of the switch. See FIG. 6 in particular, and col. 7. His switches are "gain guided" so that at zero bias, portions of his waveguide "disappears". In sharp contrast, the switches of the present invention employ index-guided-channel waveguides, having strip-loaded ribs, buried inverted ribs, or other embedded corrugations, producing a lateral index step for horizontal confinement of light as well as the vertical confinement. In the present invention, band-to-band optical absorption in the waveguide at zero or reverse bias, produces the desired optical attenuation, in contrast with the lateral fanning-out of light which occurs in waveguide portions of all of Fujiwara's devices. As a result, our on-off light contrast ratio will be 1000/1 or more in contrast with Fujiwara result, estimated at 100/1 or less which will thus produce more crosstalk than switches of the present invention. Regarding his directional coupler of FIGS. 3 and 4, one of the waveguides will disappear so that he doesn't teach a true 2×2 directional coupler switch where both data channels are preserved at both outputs, for both the bar and cross states, and thus light-modulated data would be lost.

Although he suggests utilizing refractive index changes and gain differences in what he calls a directional coupler, he cannot preserve both data channels, as one waveguide disappears. That is, he never has two index-guided channels for a true 2×2 interferometric directional coupler.

U.S. Pat. No. 4,737,003 to Matsumura teaches quantum well switching devices with carrier injection at cross-over guide portions. These however are of the deflection or refraction type, as is U.S. Pat. No. 4,784,451 to Nakamura et al, and carrier injection to produce optical gain is not taught therein.

SUMMARY OF PREFERRED EMBODIMENTS OF THE INVENTION

New, lossless 2×2, N×N and 1×N electro-optical index-guided-wave switches in III-V multi-quantum-well waveguides are provided, which incorporate traveling-wave optically amplifying channel waveguides with laser-like cross-sections. Selected waveguide segments are made transparent or opaque by biasing the selected waveguide segments forward-or-zero, or less preferably forward-or-reverse. Continuous carrier injection into the remaining segments employing D.C. forward bias produces gain and transparency for the switch. The novel branching structures have no critical lengths, an equal-path structure, and gentle bends. Relatively low current densities produce amplification that overcomes the branching losses. An analysis of spontaneous emission noise has identified quantum-well devices, preferably having less than four wells, and most preferably a single well, as the switches best suited for cascading into large-scale switching networks such as a 10-stage network with 1024 switched output channels or a 32×32 tree-structured matrix switch. The principal advantages of the switch, O-dB loss and −30 dB crosstalk, are supplemented by small size, low driving power, 1 ns switching speed, and unipolar control. The optical switches are fully compatible with III-V laser diodes, III-V photodetectors, and high-speed III-V electronic circuits, thereby promoting monolithic integration of the active switches with electronics and guided-wave optics. Also, the switches are unusual as they can use single or multi-mode waveguides.

BRIEF DESCRIPTIONS OF THE DRAWINGS

Other objects, features, and advantages of the present invention will become apparent upon study of the following description taken in conjunction with the drawings in which.

DETAILED DESCRIPTION OF PREFERRED EMBODIMENTS OF THE INVENTION

Figure 3:
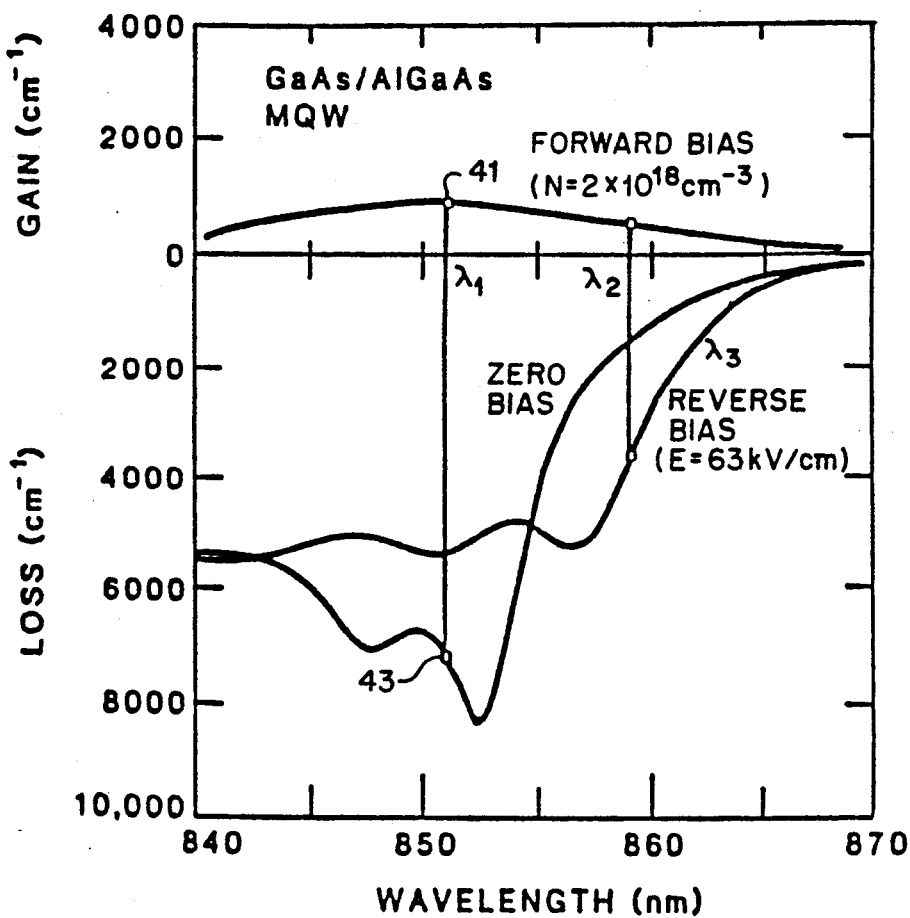
FIG. 3 illustrates gain and loss factors as a function of wavelength and bias.

To understand the operation of our active switches, it is important to know the current-controlled spectra of gain and loss, both in bulk heterostructure material and MQW material. We shall assume that the active material is located in the intrinsic or lightly doped region of an p-i-n or p+−n−−n+diode. The number of layers, the layer thicknesses, and the doping of the layers is much like that in a laser diode, except there are no reflectors at the ends. The III-V active material will be injected or depleted depending upon the polarity of voltage applied to the diode. If we consider the case of a multi-quantum-well material with about 100 angstrom GaAs wells and about 100 angstrom AlGaAs barriers, we find the result shown in FIG. 3, which is a composite drawing of experimental curves taken from the literature. See D. A. B. Miller, D. S. Chemla, T. C. Damen, A. C. Gossard, W. Wiegmann, T. H. Wood, and C. A. Burrus, "Electric-field dependence of optical absorption near the band gap of quantum well structures", Physical Review B, 32, p. 1043 (15 July 1985); D. A. B. Miller, J. S. Weiner, and D. S. Chemla, "Electric-field dependence of linear optical properties in quantum-well structures", IEEE J. of Quantum Electronics, QE-22, p. 1816 (September 1986); A. Tomita and A. Suzuki, "Carrier-induced lasing wavelength shift for quantum well laser diodes", IEEE J. of Quantum Electronics, QE-23, p. 1155 (July 1987). We have identified two wavelengths $\lambda_1$ and $\lambda_2$ that are useful for device operation. The spectral curves for bulk heterostructures are roughly similar to those in FIG. 3. The ordinate expressed in $cm^{-1}$, is the so-called bulk quantum-well gain.

Figure 1:
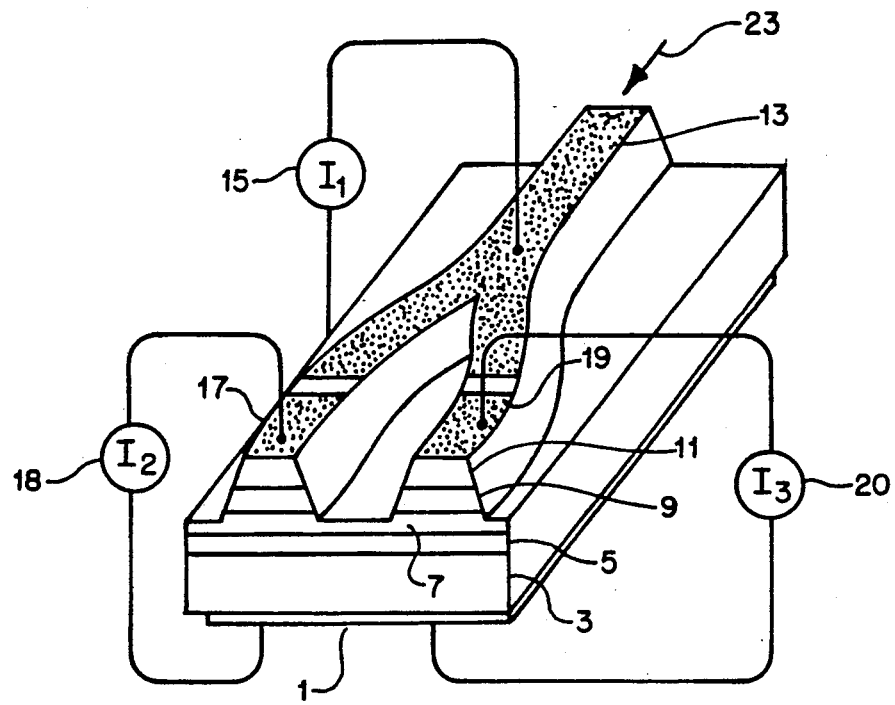
FIG. 1 illustrates a junction splitter one-by-two or one-by-N switch embodying the present invention.

FIG. 1 illustrates a $1 \times 2$ channel waveguide structure for the traveling-wave amplifiers, the ends being anti-reflection coated. The etching profile, the doping, the active-region composition and the cladding-layer composition are chosen so that the waveguide is strongly index-guided, rather than gain-guided. In most applications, the waveguide will be a single-mode structure, which leads to submicron and micron cross-sections. For example, the height of the active region 7 would be typically 0.1 to 0.2 um, with a 1 to 2 um rib width. The active region is arranged to have a strong overlap with the guided-mode optical field (a large "filling factor"). This means that the gain region would be centered in the waveguide core, or would be contiguous with the core.

More specifically, layer 1 is a base electrode, layer 3 is n+AlGaAs, layer 5 is n-AlGaAs, active layer 7 for producing amplification of light, preferably comprises four or less GaAs/AlGaAs quantum wells and most preferably a single quantum well. Layer 9 is p-AlGaAs, layer 11 is P+AlGaAs, and layers 13, 17 and 19 are conductive electrodes. Current source 15 coupled to common Ohmic electrode 1 and upper electrode 13 comprises a carrier injection means for continuously injecting carriers into first portions of the waveguide positioned under electrode 13 to amplify the intensity of light therethrough. Electrodes 17 and 19 are connected to voltage or current sources 18 and 20. These electrodes are positioned over second waveguide portions which comprise branches as illustrated. Light entering at 23 may be switched to the right hand branch by forward biasing this branch so that current source 20 injects carriers into the right hand branch for gain via electrode 19. At the same time source 18 zero biases the left hand branch so that light is blocked therethrough. If light is to be switched to the left hand branch, the source 20 zero-biases the right hand branch for loss and source 18 amplifies light traveling through the left hand branch 17. Thus FIG. 1 illustrates a junction splitter where the light enters at the rear portion indicated at 23. This switch may also be characterized as a one-by-N switch when cascaded. If light is applied to one of the branches, to emerge from the rear portion of the switch, the device would function as a junction collector or N by one switch. Thus sources 18 and 20 with their associated electrodes comprise means for intermittently injecting carriers into selected second portions of the waveguide under electrodes 17 and 19.

Figures 2A, 2B:
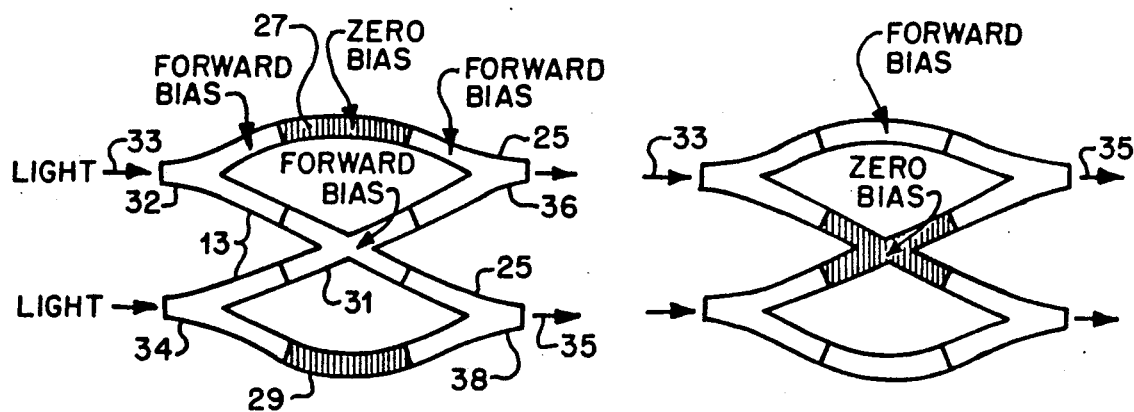
FIGS. 2A and 2B illustrate a two-by-two switch embodying the present invention.

FIG. 2a, 2b show a top view of our $2 \times 2$ switch consisting of gently curved channels 27 and 29, two of which intersect at an angle of 8° or more, so that optical crosstalk from that waveguide crossover is negligible; a 15° crossing would be a good choice in practice. We use an in-line geometry in which the input-guides 33 and 34, and the output waveguides 36 and 38 run parallel to one another, rather than at an angle as in Ikeda. The resulting in-line structure is versatile and works well with a variety of $N \times N$ switching networks. Independent biasing of different portions of the switch is provided and segments that are forward biased at $1 \times 10^{18}$ electrons/cm$^3$ or more, become traveling-wave optical amplifiers. Segments with zero or reverse bias indicated by shading in FIG. 2a, 2b, 4 and 5, will be highly lossy waveguides. Care must be taken to minimize stray optical reflections at the interface between waveguide segments, because those discontinuities would lead to unwanted feedback, possibly to oscillation, and to multiply reflected noise. Although we could have used a straight waveguide for the upper and lower paths 27 and 29 in the switch, we chose instead a gently curved guide so that the optical path length will be the same over all four possible paths within the switch Thus, the total gain length is the same in both the cross and bar states which is not true for Ikeda's switch. Note that we have also eliminated the sharp bends seen in Ikeda's approach. Another departure from Ikeda's structure is that we propose to switch only the mid-region of the device as shown. There are two $1 \times 2$ Y-junction splitters 13 at the input of the switch, and two $2 \times 1$ Y-junction collectors (combiners) 25 at the output of the switch. The input-output Y-couplers are never switched: they are always dc forward biased by carrier injection means described above, that is source 15 and electrodes 1 and 13 of FIG. 1. The electrodes and sources have been omitted from FIGS. 2a, 2b and 4–6 in the interest of clarity and brevity.

The mid-regions, at 27, 29 and 31, are switched between forward and zero bias, or less preferably forward and reverse bias. Forward bias is placed on those mid-segments intended to transmit light. The gain overcomes the 3 dB branching loss and the 3 dB combining loss, while zero bias is applied to segments intended to "block" the passage of light. For the reverse-biased case, the quantum-confined Stark effect (Franz-Keldysh effect in bulk), and the resulting electro-absorption produces the desired attenuation of light in the waveguide. In order to achieve low transmission in the zero bias state at 43 of FIG. 3, and high transmission in the forward state, we choose a wavelength of operation at 41 and thus the appropriate wavelength is near the middle of the gain curve. An important feature of these switches is that they are non-interferometric; rather, they are light amplitude controlled, and thus there are no critical interaction or coupling lengths.

The concept of using forward or zero bias in the same laser-like structure has been verified experimentally. By changing the applied voltage, strong optical absorption or gain was observed at 855 nm, indicated at 41 in FIGS. 3, in an AlGaAs buried heterostructure.

Thus it should now be appreciated that the two-by-two switch shown in both states in FIGS. 2a and 2b has a cross-sectional structure of a semiconductor laser and preferably a quantum well laser wherein the active layer 7 has four quantum wells or less and most preferably a single quantum well. The outer portions of the mid-section of the switch has a gently curved configuration. The inner portions of the second waveguide portion comprises a switching portion 31 having an X-shaped configuration as shown. Thus first electrode means continuously applied at first voltage levels to the junction splitters and collectors. The second waveguide portions include first sub-portions comprising a pair of gently curved waveguide sections 27 and 29 connected between the outer branches of the junction splitters and junction collectors together with a second sub-portion connecting the inner branches of the junction splitters with the inner branches of the junction collectors. Thus, the two-by-two switch is configured to have equal light paths lengths therethrough regardless of the state of the switch. The forward-bias levels (both d.c. and switched) are adjusted so that the 2×2 switch is transparent to produce an overall insertion loss of 0 dB (net gain of 0 dB) including lead-in/lead out waveguides.

Figure 4:
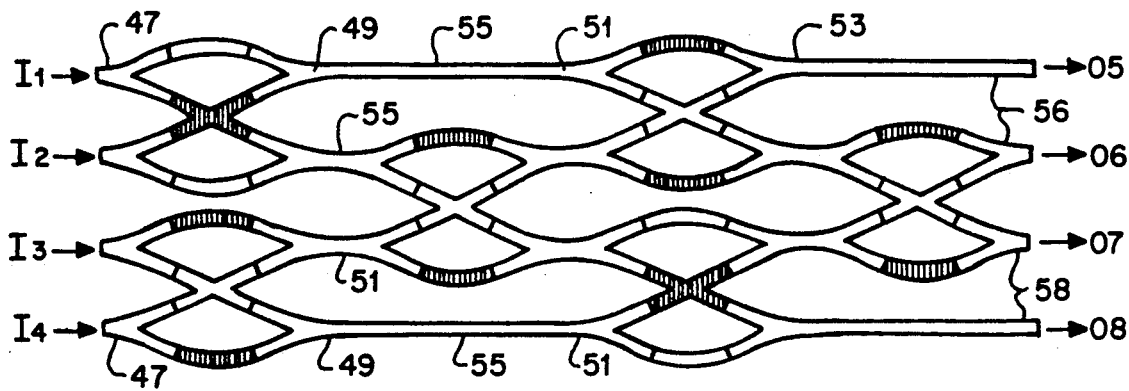
FIGS. 4 and 6 illustrate N×N switches of the invention, (N=4).
Figure 5:
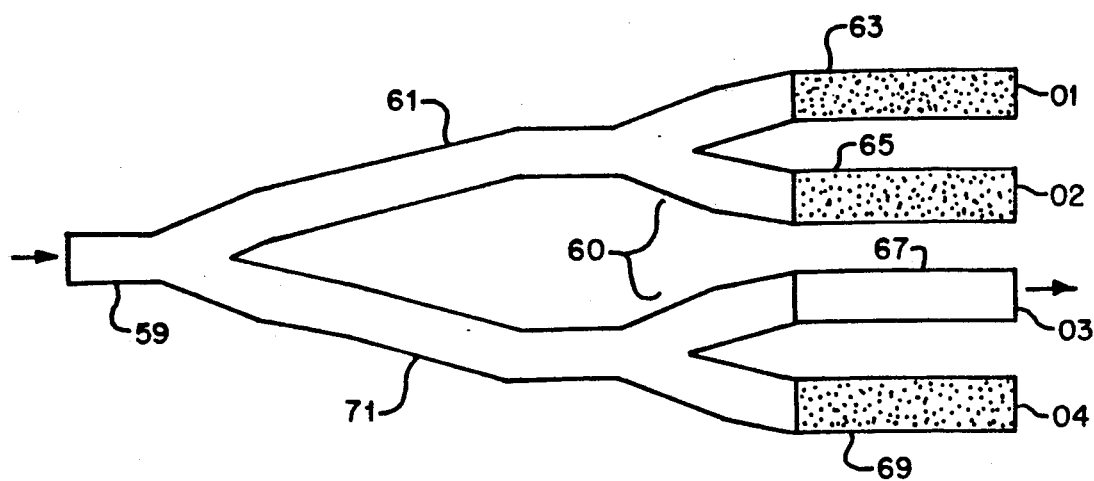
FIG. 5 illustrates a one-by-four switch embodying the invention.
Figure 6:
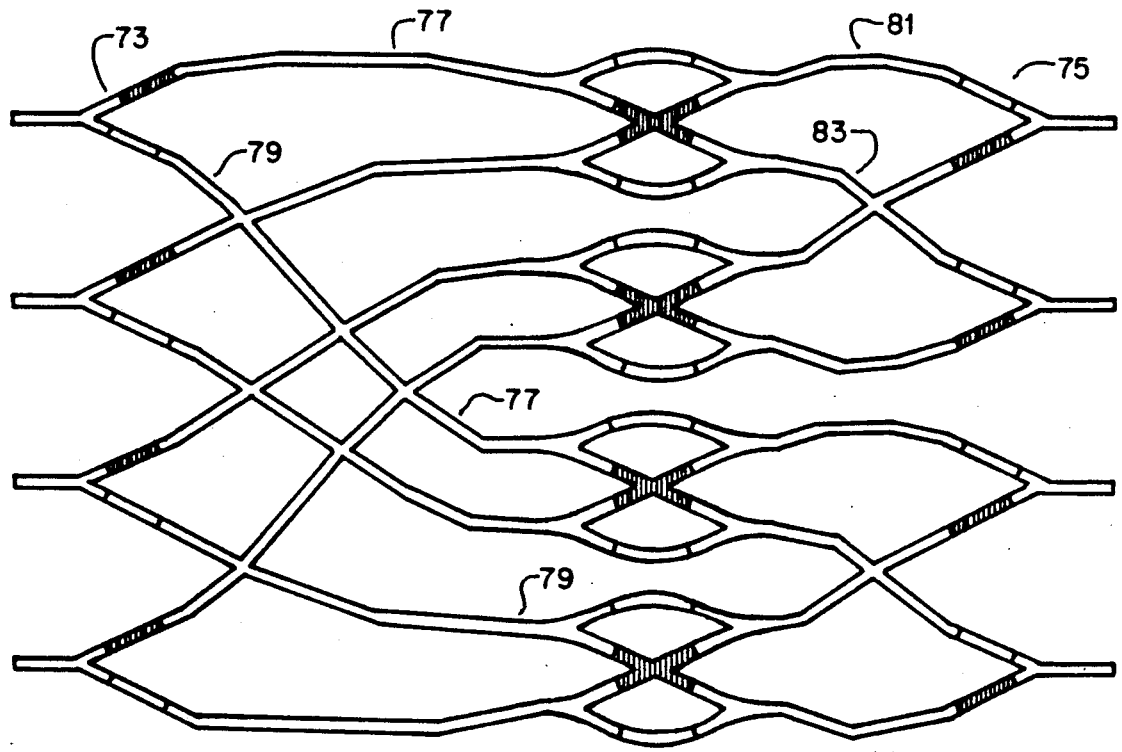

The N×N permutation matrix of FIG. 4 is a nonblocking network with a regular path structure, well adapted for our amplifying switch. Using the two x two switch of FIG. 2 as a building-block switch, we have devised in FIG. 4 an N×N integrated-optic network for the example of four inputs and four outputs. Extension to higher N is straightforward. Networks for 1×N optical switching can also be constructed by successive branching of an amplifying optical waveguide. FIG. 5 shows a proposed 1×4 switch with a tree-type architecture. One or more output channels is selected by supplying gain to those paths and by blocking the undesired channels. A steady forward bias is applied to the input portion of the 1×2 or 1×4 switch, up to the final vertex (or vertices). Beyond the vertex, optical loss is introduced selectively into addressed regions as shown. The overall loss along any desired path is 0 dB.

More specifically, as seen in FIG. 4, a first plurality of two-by-two switches is provided, each two-by-two switch having light input portions 47 and light output portions 49 together with light transmissive coupling means 55 for coupling the light output portions of these switches with light input portions 51 of a second plurality of the two-by-two switches. Importantly, the coupling means 55 are all substantially parallel with respect to each other, enabling the N×N switch to have substantially equal light paths therethrough. The light input portions 47, the light output portions at 56 and 58 and the coupling waveguides 55 comprise first waveguide portion which are preferably always forward biased to induce the desired gain in light intensity traveling therethrough, to thus overcome the light losses described above. The mid-sections of each two-by-two switch are selectively forward biased or zero biased just as explained in connection with FIGS. 2a and 2b to perform the desired switching function of the N×N switch.

In the example shown in FIG. 4 an input at 11 will be routed through the switch so that the light inputted at 11 will exit at output portion 07 since the shaded areas, indicating zero bias conditions, will block the passage of light therethrough. In like manner, light inputted at 13 will emerge only at output portion 08. It may be observed that the two-by-two switches are arranged in staggered linear arrays to enable a compact switching arrangement along with relatively smooth waveguide paths through the device.

As indicated in FIG. 5, two Y-junction splitters 60 form portions of the larger left hand junction splitter comprising input portion 59 and branches 61 and 71, which three junction splitters comprise a first waveguide portion which is always forward biased. The second waveguide portions include output legs 63, 65, 67 and 69. Should we wish to cause the light entering at portion 59 to emerge from 03, 63, 65 and 69 are zero biased to produce the aforesaid blockage of light, whereas portion 67 would be forward biased to cause the light to be emitted at portion 03. This 1×N or multiplexer switch would operate in the same manner as an N×1 or demultiplexer switch by inputting light at 01–04 and outputting light at 59. By cascading these switches, larger networks having a larger N may be fabricated.

Thus numerous configurations of the aforesaid switches may be constructed. For example in FIG. 6, another N×N switch is provided, having a plurality of switchable 1×2 input junction splitters 73, a plurality of switchable 2×1 output junction collectors 75, together with first light coupling means 77, 79 for coupling input portions of the two×two switches to output portions of the junction splitters, and second coupling means 81, 83 for coupling output portions of the two×two switches to input portions of the junction collectors. The construction and operation of the switchable input junction splitters and the switchable output junction collectors have already been described in connection with FIG. 1. Thus by selectively forward biasing the legs of the junction splitters and junction collectors and selectively operating the two×two switches as previously explained a four×four switch is provided utilizing, in this case, a single linear array of two×two switches. The coupling channels are preferably always forward biased, as in the switch of FIG. 4.

Amplification of spontaneously emitted photons is the most critical issue in an active switching network. The spontaneous emission noise will build up as the number of cascaded switching stages increases. Eventually, the noise power will begin to saturate the last amplifying element. This will set a limit on the number of stages that can be cascaded. In the analysis, we say that the accumulated dc noise power (and the amplified signal) shall not exceed the saturation power of the gain medium. After a lengthy computation, this leads to the following result for the maximum usable number of switching stages:

$$M = \left[ 1 + \frac{F\alpha \ln(1/\alpha)}{E(1 - \alpha)} \right].$$

Figure 7:
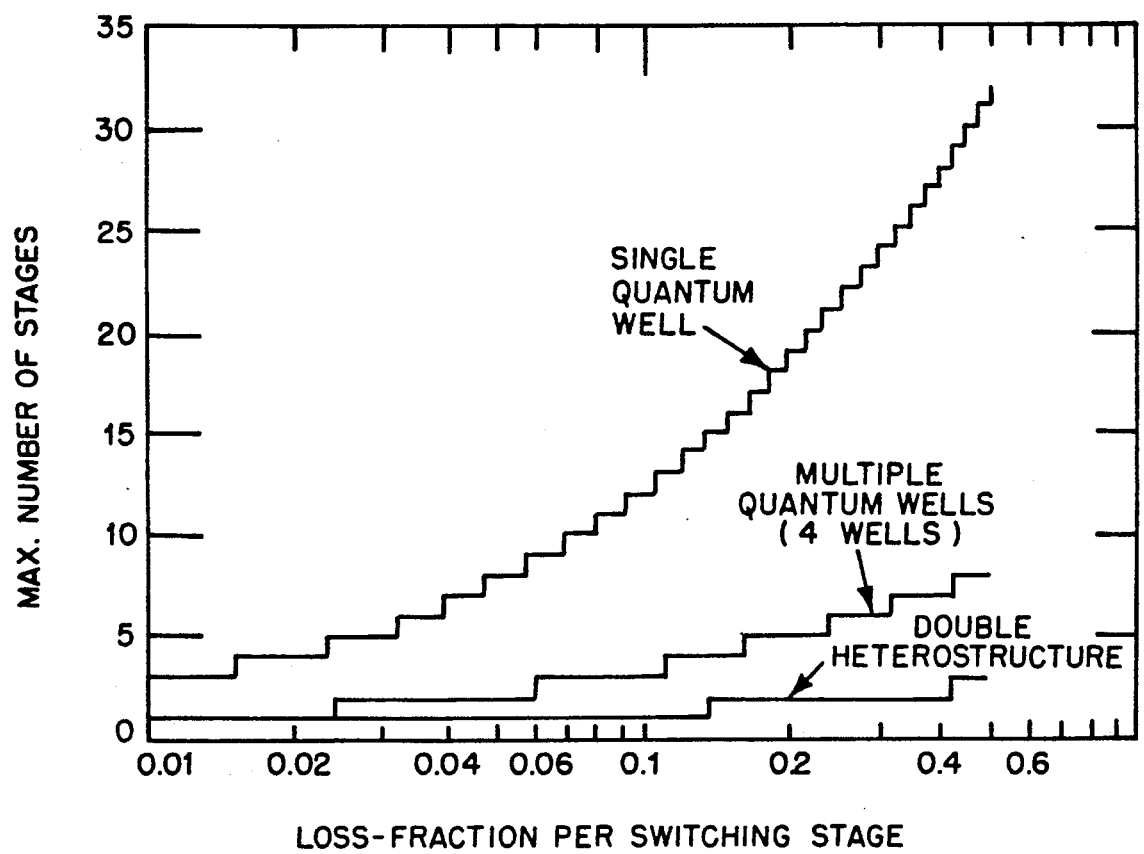
FIG. 7 illustrates estimated maximum number of cascaded switching stages for various types of active regions 7.

F is the saturation optical power, and E is the spontaneous emission noise power defined as:

$$F = \frac{h\nu\nu}{g\tau_s} \quad E = \left( \frac{h\nu VN}{\tau_s} \right)\left( \frac{d\Omega}{4\pi} \right)$$

where hv is the photon energy, v is the velocity of light in the guide, g is the differential gain coefficient, $\tau_s$ is the spontaneous-emission lifetime, V is the active volume per stage, N the carrier density, and $d\Omega/4\pi$ the solid-angle capture of noise by the guide. The network has 0 dB insertion loss and each switching stage has unity gain: a=1, where is the optical splitting-and-combining loss per stage. F is approximately 3.3 mW in GaAs at 850 nm with $\tau_s$=3 ns. With core and cladding indices of 3.55 and 3.35 respectively, the fractional noise capture $d\Omega/4\pi$ is about 0.07. The injection level N needed for G<10 over 1 mm stage is approximately $1 \times 10^{18}$ cm$^{-3}$. The mode volume is approximately 0.15um×1.5um×1mm. Therefore, for a regular double heterostructure 0.15 um thick, E=1100 uW, while we have E=73 uW for a single quantum well structure 100A thick (E=292 uW for four wells). Putting these numbers into Equation (1), we obtain the result shown in FIG. 7. For an M-fold tree of 1×2 switches where $\alpha$=0.5, we find that M=3 for the double heterostructure, M=8 for four wells, and M=32 for the SQW (a large number!). Turning to the 2×2 switch in which $\alpha$=0.25, we obtain M=2 for the DH, M=6 for the MQW and M=21 for the SQW. Clearly, the single-quantum-well (SQW) active network is very promising. The MQW network is appealing also.

We have estimated the bulk gain coefficient required in each 2×2 switch. This coefficient is expressed in relation to two other coefficients: $\alpha_w$ the waveguide scattering-loss coefficient, and the bulk material loss coefficient found during reverse or zero bias. Along transparent paths, the net gain across the overall length L of the switch is:

$$\text{gain(dB)} = 10 \log[\alpha \exp(\Gamma(\alpha_f - \alpha_w))L].$$

On opaque paths where attenuators fill 50% of the length, the net loss is:

$$\text{loss(dB)} = 10 \log[\alpha \exp(\Gamma(.5(\alpha_r + \alpha_w) - .5(\alpha_f - \alpha_w)))L].5L.$$

where $\Gamma$ is the spatial overlap factor of the guided-mode profile with the gain-or-loss distribution across the MQW waveguide. The mode gain of the quantum-well waveguide is $\Gamma(\alpha_f - \alpha_w)$, and it is known that $\Gamma\alpha_w = 3$ to 5 cm$^{-1}$. As an example, let us consider $\alpha$=0.25, $\Gamma$=0.2, and L=1 mm. Then, we find that 0-dB gain occurs at $\alpha_f - \alpha_w = 69$ cm$^{-1}$ which is attainable at modest injection levels. In addition, we find that an optical crosstalk of −30 dB is obtained when $\alpha_r - \alpha_f + 2\alpha_w = 830$ cm$^{-1}$, which is easy to achieve in practice (−50 dB crosstalk occurs at 1,290 cm$^{-1}$). The large gains that are feasible in single quantum wells will compensate for their small $\Gamma$ factors.

While there has been described what is at present considered to be the preferred embodiments of this invention, it will be obvious to those skilled in the art that various changes and modifications may be made therein without departing from the invention and it is, therefore, intended in the appended claims to cover all such changes and modifications as fall within the true spirit and scope of the invention, including art recognized equivalents.

What is claimed is:

1. Non-interferometric guided wave electro-optic switch comprising a light transmitting semiconductor index-guided waveguide having a cross-sectional laser-like structure, together with carrier injection means for continuously injecting carriers into first portions of said waveguide to amplify the intensity of light transmitted therethrough and for intermittently injecting carriers into at least one second portion of said waveguide to change the state of said switch, and wherein said carrier injection means comprises a first set of electrodes for continuously applying first voltage levels to first waveguide portions of said switch for producing amplification of light traveling through said first waveguide portions together with a second set of electrodes for selectively applying to selected second waveguide portions either said first voltage levels for producing light amplification, or second voltage levels to block the transmission of light therethrough.

2. The switch of claim 1, wherein said first waveguide portions include junction splitters having N branches, where N is an integer greater than one, and wherein N discrete second waveguide portions are adjacent associated branches of said first waveguide portion.

3. The switch of claim 2 wherein said semiconductor laser-like structure has a quantum well core therein.

4. A non-interferometric guided wave two-by-two electro-optic switch having a bar state and a cross state comprising a light transmissive semiconductor index-guided waveguide having a cross-sectional structure of a semiconductor laser, together with carrier injection means for continuously injecting carriers into first portions of said waveguide and for intermittently injecting carriers into second portions of said waveguide to change the state of said switch, said carrier injection means including first electrode means for continuously applying first voltage levels to first waveguide portions of said switch for producing amplification of light traveling through said first waveguide portions, said first waveguide portions including a pair of input junction splitters each having an outer and inner branch and a pair of output junction collectors each having an outer and inner branch, and wherein said second waveguide portions include first sub-portions comprising a pair of waveguide sections connected between the outer branches of said junction splitters and the outer branches of said junction collectors, together with a second sub-portions connecting the inner branches of said junction splitters with the inner branches of said junction collectors, said second waveguide sub-portions having an X shaped crossover configuration, and second electrode means for producing amplification of light traveling through said first sub-portions and for concurrently blocking light passing through said second sub-portion when said switch is in the bar state, and vice versa when said switch is in the cross state.

5. The switch of claim 4 wherein said switch is configured to have equal light path lengths therethrough regardless of the state of said switch.

6. The two-by-two switch of claims 4 or 5, wherein said semiconductor laser-like structure has a quantum well core therein.

7. An N×N electro-optic switch comprising a matrix of two-by-two switches of claim 6, each having light input and light output portions, and wherein said first waveguide portions include light transmissive coupling means for coupling light output portions of a plurality of said two-by-two switches with light input portions of a plurality of said two-by-two switches, said light transmitting coupling means being substantially parallel with respect to each other, enabling said N×N switch to have substantially equal light path lengths therethrough, regardless of the states of said two-by-two switches.

8. The N×N electro-optic switch of claim 7 wherein said two-by-two switches are positioned in staggered linear arrays.

9. The switch of claim 8 wherein said core has four quantum wells or less therein.

10. The switch of claim 9 wherein said core has a single quantum well therein.

11. The switch of claim 7 wherein said waveguide has a p-i-n diode cross-sectional structure having a centrally positioned quantum well core therein.

12. The switch of claim 7, wherein said second voltage levels induce light transmissivity losses in second waveguide portions substantially greater than light gain induced in said first waveguide portions to minimize crosstalk.

13. The guided wave switch of claim 7 wherein said pair of waveguide sections are gently curved.

14. The guided wave switch of claim 6 wherein said core has a four quantum wells or less therein.

15. The guided wave switch of claim 14 wherein said core has a single quantum well therein.

16. An $N \times N$ electro-optic switch comprising a matrix of two-by-two switches of claims 4, or 5 each having light input and light output portions, and wherein said first waveguide portions include light transmissive coupling means for coupling light output portions of a plurality of said two-by-two switches with light input portions of a plurality of said two-by-two switches, said light transmitting coupling means being substantially parallel with respect to each other, enabling said $N \times N$ switch to have substantially equal light path lengths therethrough, regardless of the states of said two-by-two switches.

17. The $N \times N$ electro-optic switch of claim 16 wherein said two-by-two switches are positioned in staggered linear arrays.

18. The $N \times N$ switch of claim 16, wherein said carrier injection means continuously injects carriers into said light transmissive coupling means for amplifying light transmitted therethrough.

19. The guided wave switch of claim 18 wherein said pair of waveguide sections are gently curved.

20. The switch of claim 16, wherein said waveguide has a p-i-n diode cross-sectional structure having a centrally positioned quantum well core therein.

21. The switch of claim 16, wherein said second voltage levels induce light transmissivity losses in second waveguide portions substantially greater than light gain induced in said first waveguide portions to minimize crosstalk.

22. The switch of claim 4 or 16 wherein said second voltage levels bias said switch to zero volts.

23. The guided wave switch of claim 16 wherein said pair of waveguide sections are gently curved.

24. An $N \times N$ electro-optic switch comprising a plurality of two-by-two switches of claims 4, or 5, a plurality of one-by-two switches, a plurality of two-by-one switches, first light coupling means for coupling input portions of said two-by-two switches to output portions of said one-by-two switches, and second coupling means for coupling output portions of said two-by-two switches to input portions of said two-by-one switches.

25. The $N \times N$ switch of claim 24, wherein said carrier injection means continuously injects carriers into said first and second light transmissive coupling means for amplifying light transmitted therethrough.

26. The guided wave switch of claim 25 wherein said pair of waveguide sections are gently curved.

27. The switch of claim 24, wherein said second voltage levels bias said switch to zero volts.

28. The guided wave switch of claim 24, wherein said pair of waveguide sections are gently curved.

29. The switch of claim 1, 2, 4, or 5, wherein said waveguide has a p-i-n diode cross-sectional structure having a centrally positioned quantum well core therein.

30. The switch of claims 1, 2, 4, 5, wherein said second voltage levels induce light transmissivity losses in second waveguide portions substantially greater than light gain induced in said first waveguide portions to minimize crosstalk.

31. The guided wave switch of claim 4, or 5 wherein said pair of waveguide sections are gently curved.

32. The guided wave switch of claim 6 wherein said pair of waveguide sections are gently curved.

* * * * *